United States Patent
Lauermann et al.

(10) Patent No.: US 10,475,963 B2
(45) Date of Patent: Nov. 12, 2019

(54) LIGHT EMITTING DIODE

(71) Applicant: AZUR SPACE Solar Power GmbH, Heilbronn (DE)

(72) Inventors: Thomas Lauermann, Heilbronn (DE); Wolfgang Koestler, Heilbronn (DE); Bianca Fuhrmann, Heilbronn (DE)

(73) Assignee: Azur Space Solar Power GmbH, Heilbronn (DE)

( * ) Notice: Subject to any disclaimer, the term of this patent is extended or adjusted under 35 U.S.C. 154(b) by 0 days.

(21) Appl. No.: 15/919,741

(22) Filed: Mar. 13, 2018

(65) Prior Publication Data

US 2018/0261726 A1   Sep. 13, 2018

(30) Foreign Application Priority Data

Mar. 13, 2017   (DE) ........................ 10 2017 002 333

(51) Int. Cl.
| | |
|---|---|
| *H01L 29/06* | (2006.01) |
| *H01L 31/0328* | (2006.01) |
| *H01L 31/0336* | (2006.01) |
| *H01L 31/072* | (2012.01) |
| *H01L 31/109* | (2006.01) |
| *H01L 33/38* | (2010.01) |

(Continued)

(52) U.S. Cl.
CPC .......... *H01L 33/38* (2013.01); *H01L 33/0062* (2013.01); *H01L 33/06* (2013.01); *H01L 33/10* (2013.01); *H01L 33/14* (2013.01); *H01L 33/22* (2013.01); *H01L 33/30* (2013.01); *H01L 33/145* (2013.01); *H01L 2933/0066* (2013.01); *H01L 2933/0083* (2013.01)

(58) Field of Classification Search
CPC .............. H01L 21/6836; H01L 21/304; H01L 21/3043; H01L 21/78; H01L 33/24; H01L 33/38; H01L 33/06; H01L 33/30; H01L 33/10; H01L 33/0062; H01L 33/22; H01L 33/14
USPC ............................................ 257/13
See application file for complete search history.

(56) References Cited

U.S. PATENT DOCUMENTS

| | | |
|---|---|---|
| 5,779,924 A | 7/1998 | Krames et al. |
| 7,994,519 B2 | 8/2011 | Fehrer et al. |

(Continued)

FOREIGN PATENT DOCUMENTS

| | | |
|---|---|---|
| DE | 197 09 228 A1 | 9/1997 |
| DE | 10 2007 032 555 A1 | 1/2009 |

*Primary Examiner* — David S Blum
(74) *Attorney, Agent, or Firm* — Muncy, Geissler, Olds & Lowe, P.C.

(57) ABSTRACT

A light-emitting diode with a stacked structure, having a first region and a second region and a third region, wherein all three regions have a substrate and an n-doped lower cladding layer and an active layer generating electromagnetic radiation, wherein the active layer includes a quantum well structure, and a p-doped upper cladding layer, and the first region additionally has a tunnel diode formed on the upper cladding layer and composed of a p+ layer and an n+ layer, and an n-doped current distribution layer. The current distribution layer and the n-doped contact layer are covered with a conductive trace. At least the lower cladding layer, the active layer, the upper cladding layer, the tunnel diode, and the current distribution layer are monolithic in design. The second region has a contact hole with a bottom region.

10 Claims, 2 Drawing Sheets

(51) Int. Cl.
*H01L 33/06* (2010.01)
*H01L 33/30* (2010.01)
*H01L 33/10* (2010.01)
*H01L 33/00* (2010.01)
*H01L 33/22* (2010.01)
*H01L 33/14* (2010.01)

(56) References Cited

U.S. PATENT DOCUMENTS

| | | | | |
|---|---|---|---|---|
| 8,486,738 | B2 * | 7/2013 | Chao | H01L 33/405 |
| | | | | 257/13 |
| 8,659,033 | B2 * | 2/2014 | Yu | H01L 33/007 |
| | | | | 257/13 |
| 2014/0077158 | A1 * | 3/2014 | Crowder | H01L 33/18 |
| | | | | 257/13 |
| 2014/0191191 | A1 * | 7/2014 | Huang | H01L 33/24 |
| | | | | 257/13 |
| 2015/0325745 | A1 * | 11/2015 | Hwang | H01L 33/16 |
| | | | | 257/13 |
| 2016/0133790 | A1 * | 5/2016 | DeMille | H01L 33/22 |
| | | | | 257/13 |

* cited by examiner

LIGHT EMITTING DIODE

This nonprovisional application claims priority under 35 U.S.C. § 119(a) to German Patent Application No. 10 2017 002 333.6, which was filed in Germany on Mar. 13, 2017, and which is herein incorporated by reference.

BACKGROUND OF THE INVENTION

Field of the Invention

The present invention relates to a light-emitting diode.

Description of the Background Art

A light-emitting diode is known from DE 197 09 228 A1, which corresponds to U.S. Pat. No. 5,779,924, that has textured regions in order to improve light outcoupling, wherein the boundary surface texturing has periodically successive peaks and valleys.

In addition, a light-emitting diode is known from DE 10 2007 032 555 A1, which corresponds to U.S. Pat. No. 7,994,519, that has an injection barrier between a contact layer and an active region in order to improve efficiency, wherein the injection barrier suppresses a vertical flow of current from the contact toward the active region.

SUMMARY OF THE INVENTION

It is therefore an object of the invention to provide a device that advances the state of the art.

In an exemplary embodiment of the invention, a light-emitting diode having a stacked structure with a top and a bottom is provided.

The stacked structure, composed predominantly of III-V semiconductor layers, has at the top a first region and a second region and a third region, wherein all three regions have the following semiconductor layers in the stated sequence: a substrate and an n-doped lower cladding layer and an active layer that generates electromagnetic radiation, wherein the active layer includes a quantum well structure, and a p-doped upper cladding layer.

The first region additionally can have a tunnel diode that is formed on the upper cladding layer and is composed of a $p^+$ layer and an $n^+$ layer, wherein the $p^+$ layer of the tunnel diode consists of a III arsenide or includes a III arsenide, and the $n^+$ layer of the tunnel diode consists of a III phosphide or includes a III phosphide.

The first region also can have an n-doped current distribution layer, wherein the current distribution layer consists of a III arsenide or includes a III arsenide.

The first region can have an n-doped contact layer, wherein the n-doped contact layer consists of a III arsenide or includes a III arsenide.

The n-doped contact layer can be covered with a conductive trace.

The additionally stated layers for the first region can be arranged in the stated sequence.

At least the lower cladding layer, the active layer, the upper cladding layer, the tunnel diode, and the current distribution layer are monolithic in design.

The second region and the third region may not have, or at least in part do not have, the additional layers of the first region.

The second region can have a contact hole with a bottom region, wherein the following layers are additionally formed in the bottom region of the contact hole: An injection barrier formed in a planar manner in the upper cladding layer or at the surface of the upper cladding layer or above the upper cladding layer in order to suppress a current flow opposite the stacking direction, and a conductive trace with which the injection barrier is covered.

The third region can be textured in design, wherein the texture has recesses, and the recesses extend all the way through the current distribution layer and through the $n^+$ layer of the tunnel diode.

It should be noted that the contact hole can have a flat bottom region. In an embodiment, the bottom region may be composed of the upper cladding layer.

In an embodiment, at least the current distribution layer and the $n^+$ phosphide layer of the tunnel diode can be completely removed in the region of the bottom.

In an embodiment, the $p^+$ arsenide layer of the tunnel diode can also be absent in the bottom region, which is to say that the tunnel diode is completely removed in the region of the bottom.

The region of the contact hole can be flat on the top, and serves as a pad region for electrically contacting the LED. In other words, the pad region is connected to a terminal of the LED by means of a bond wire.

Because of the nearly closed metallization layer, no light outcoupling takes place through the second region.

It is a matter of course that all or nearly all of the light of the LED can be coupled out through the third region.

A peak can be formed between two immediately adjacent recesses. While at least the current distribution layer and the $n^+$ layer of the tunnel diode are completely removed in the bottom region of the recess, at the peaks the $n^+$ layer of the tunnel diode can be completely or almost completely present and the current distribution layer can at least partially or almost completely be present.

The regions at the top can adjoin one another, and the second region can have contact layers.

The first region can have no or almost no texturing, and can be at least partially covered by contact layers, for example, with metallic contact layers.

The side walls of the peaks in the third region may not be perpendicular in design, and the side walls can form an angle of less than 90° to the plane of the underlayer.

The division of the surface of the stack into the three regions can be carried out by means of a masking process.

The term "III arsenide" can be understood to include semiconductor materials such as, e.g., InGaAs or GaAs or AlGaAs.

Similarly, the term "III phosphide" can be understood to include semiconductor materials such as, e.g., InGaP or InAlP or InP.

The term "stacked structure" can include semiconductor layers arranged one upon the other, or the stack can be formed of the semiconductor layers arranged one upon the other.

The layers, starting from the lower cladding layer up to and including the n-doped contact layer, can be manufactured by means of a metal-organic vapor phase epitaxy (MOVPE). Depending on the manufacture, the monolithically produced layers can also be bonded to a substrate.

The additional layers resting on the active layer, including the layers of the tunnel diode, can be designed to be as transparent as possible to the emission wavelength of the active layer.

An advantage of the present structure is that the luminous efficacy can be increased in a simple and economical manner. Among the factors contributing to an increase in the luminous efficacy are the textured third regions, with which an improved light outcoupling is achieved. At the same time, current injection into the region beneath the bond pad is minimized in a simple manner with the present approach, achieving increased efficiency of the component. It should be noted that the term "luminous efficacy" can be understood to mean the luminous flux measured in mW in relation to the power consumption of the LED component.

Surprisingly, it has been shown that the topmost highly doped $N^+$ tunnel diode phosphide layer exhibits highly selective behavior with respect to wet etching. In other words, the phosphide layer represents an etch stop layer for the wet etching. Even after a relatively long wet etching time, the phosphide layer is not etched away.

In this way, it is possible to set different side wall profiles of the texture, and the height of the texture. It is a matter of course that the side walls are progressively set back as the etch time increases, and ultimately the height of the texture is reduced. Preferably, the wet etching is carried out by means of a strongly anisotropic wet etching solution, for example with a peroxide/phosphoric acid. In this process, the first regions are protected by a resist mask from attack by the wet etching solution. It is a matter of course that a dry etching process may also be used in place of wet etching.

In a subsequent process step, for example, implemented as a wet etching step, the $n^+$ phosphide tunnel diode layer can be removed. Hydrochloric acid can be used for this purpose. The $n^+$ phosphide tunnel diode layer can be removed very selectively relative to the $p^+$ arsenide tunnel diode layer located directly below it with hydrochloric acid. In an embodiment, the previously exposed $p^+$ arsenide tunnel diode layer can then be removed as well in another wet etching step.

Surprisingly, it became apparent that both the third textured regions as well as the second the contact hole can be formed simultaneously by means of a single masking step followed by etching.

It should be noted that it is very advantageous to form an injection barrier in the bottom region of the second region after etching.

In this way, the luminous efficacy can be significantly increased in a simple, reliable, and economical manner, despite etching of the n-doped current distribution layer and the $n^+$ layer of the tunnel diode. In other words, the action of the current distribution layer is not impaired or is impaired only slightly by the etching.

In an embodiment, the injection barrier includes or consists of a p-n junction and an insulation layer, or a p-n junction, or an insulation layer.

In an embodiment, a metal layer that contains n-dopants can be placed on the bottom region of the contact hole. Because the bottom region is formed by the $p^+$ tunnel diode layer, or in an improvement by the upper cladding layer, an injection barrier in the form of a blocking p-n junction can be produced simply and economically.

In an embodiment, an AlGaAs layer can be formed in the region of the bottom of the contact hole and in the recesses of the texture.

In an embodiment, a mirror layer can be located between the substrate and the lower cladding layer. The photons emitted in the active layer opposite the stacking direction are reflected back in the stacking direction by means of the mirror layer. This increases the luminous efficacy.

According to an embodiment, a bottom of the stacked structure can be composed of the substrate or of a contact layer joined to the substrate.

In an embodiment, the recesses extend through the entire tunnel diode to the upper cladding layer. In other words, both tunnel diode layers are completely removed in the bottom region of the second region and in the bottom regions of the third region.

According to an embodiment, the recesses can be designed in the shape of truncated polyhedrons or have a trough-shaped cross-section.

According to an embodiment, the recesses can have undercuts.

In an embodiment, the lower cladding layer and the upper cladding layer consist of a III arsenide or includes a III arsenide.

According to an embodiment of the invention, a manufacturing process is provided for producing a light-emitting diode with a first region and a second region and a third region, having the following method steps: providing a stacked structure composed predominantly of III-V semiconductor layers, with a top and a bottom, wherein the stacked structure has a substrate forming the bottom, a lower cladding layer, a layer generating electromagnetic radiation and having a quantum well structure, a p-doped upper cladding layer, a tunnel diode composed of a $p^+$ layer and an $n^+$ layer, an n-doped current distribution layer, and an n-doped contact layer.

The aforementioned semiconductor layers of the stacked structure can be arranged in the stated sequence.

The $p^+$ layer of the tunnel diode and the current distribution layer and the n-doped contact layer each include a III arsenide or each consist of a III arsenide.

The $n^+$ layer of the tunnel diode includes a III phosphide or consists of a III phosphide.

An application and structuring of a photosensitive layer on the top of the stacked structure during a masking process is also provided.

Next, anisotropic etching of layers can also be provided, starting from the top of the stacked structure, wherein a contact hole is formed in the second region with simultaneous etching of layers in the third region to create a texturing.

During the etching, the phosphide-containing $n^+$ layer of the tunnel diode serves as an etch stop in each of the two regions, i.e. the second region and the third region.

In an embodiment, it is provided for a formation of a planar injection barrier in the bottom region of the contact hole, and deposition and structuring of a conductive trace to fill the contact hole in the second region, and formation of terminal contact fingers in the first region.

In an embodiment, the arsenide-containing $p^+$ layer of the tunnel diode is removed in the bottom regions of the second region and in the bottom region of the third region.

In an embodiment, the phosphide-containing $n^+$ layer of the tunnel diode is removed at the bottom of the contact hole and in the recesses of the texturing.

In an embodiment, at least one etching step is carried out by means of a wet etching using a peroxide/phosphoric acid.

It is a matter of course that the masking process includes other process steps such as exposure and removal of the resist in the exposed areas. In the case of the latter, a positive resist process is assumed.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
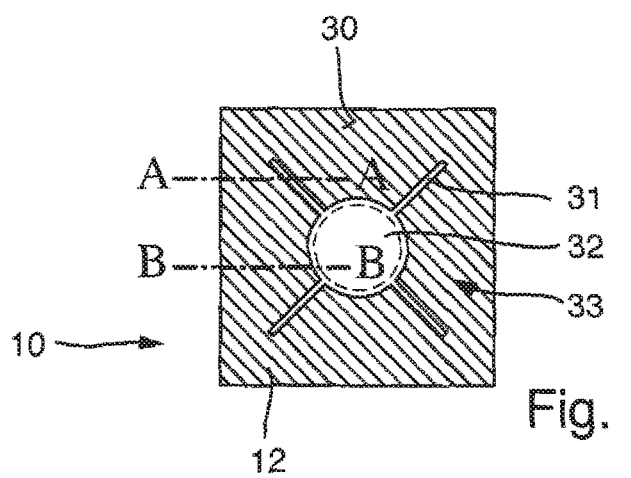
FIG. 1 is a top view of an embodiment according to the invention of a light-emitting diode.

The illustration in FIG. 1 shows a top view of an embodiment of a light-emitting diode 10 according to the invention, having a stacked structure 12 composed predominantly of III-V semiconductor materials, wherein a top 30 has a first region 31 and a second region 32 and a third region 33.

The first region 31 is designed as a ring with four fingers extending away from the ring. The second region 32 extends across the circular area enclosed by the ring. The circular area identifies a contact hole filled with a metallic layer sequence. The third region 33 extends over the remaining area of the top 30 of the stacked structure 12, and is textured.

Figure 2A:
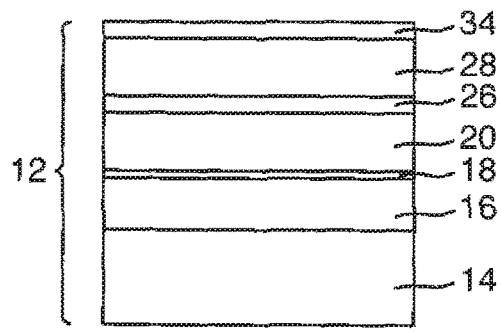
FIGS. 2A and 2B are side views of an embodiment according to the invention of a stacked structure of a light-emitting diode.

A construction of the stacked structure 12 is shown in the illustration in FIG. 2A in a side view.

The structure 12 has a substrate 14, an n-doped lower cladding layer 16, and an active layer 18 generating electromagnetic radiation. The structure 12 also has a p-doped upper cladding layer 20, a tunnel diode 26 composed of a $p^+$ layer 22 and an $n^+$ layer 24, and an n-doped current distribution layer 28. An n-contact layer 34 is arranged on the current distribution layer 28.

The layers are arranged in the stated sequence. The active layer 18 includes a quantum well structure. The layers are monolithic, which is to say that the layers are grown directly on the substrate.

Figure 2B:
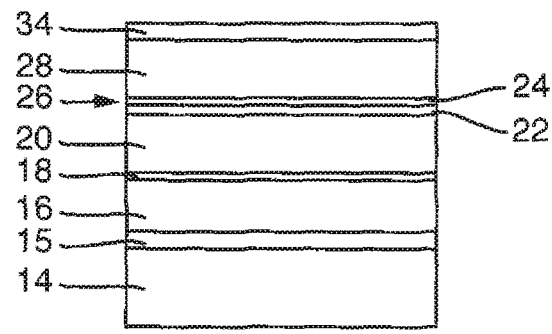

The illustration in FIG. 2B shows an alternative construction of the stacked structure 12, wherein only the layers from the lower cladding layer 16 to the n-contact layer 34 are monolithic. A mirror layer 15 is arranged between the substrate 14 and the monolithic layers.

The first region 31 is composed of the n-doped contact layer 34 and serves to couple in current.

The second region 32 is composed of the upper cladding layer 20 and the $p^+$ arsenide layer 22 of the tunnel diode 26, wherein both the current distribution layer 28 and the $n^+$ phosphide layer 24 of the tunnel diode 26 are completely absent. In an improvement, the second region 32 is composed of the upper cladding layer 20, wherein not only the current distribution layer 28 but also the $n^+$ phosphide layer 24 and the $p^+$ arsenide layer of the tunnel diode 26 are absent.

The texturing of the region 33 serves to increase light outcoupling.

Figure 3A:
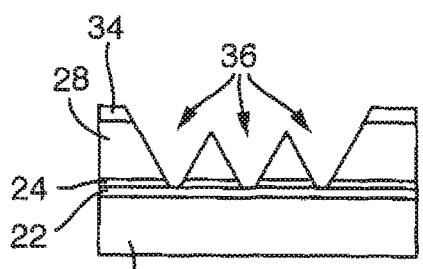
FIGS. 3A-C illustrate an embodiment of a texturing.
Figure 3B:
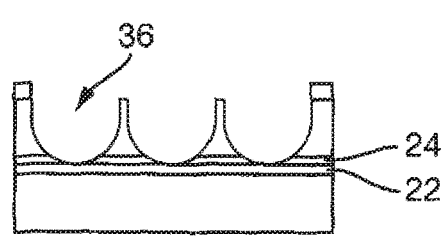
Figure 3C:
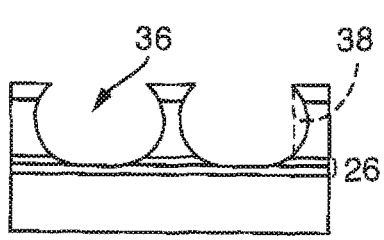

The illustrations in FIGS. 3A, 3B, and 3C show different designs for the texturing in a side view, wherein for reasons of simplicity all layers located below the upper cladding layer 20 are not shown. The texturing has recesses 36, wherein the recesses extend through the current distribution layer 28 and the $n^+$ layer 24 of the tunnel diode 26.

A cross-section of the recesses 36 is frustoconical or alternatively trough-shaped in design. According to the embodiment shown in FIG. 3C, the cross-section of the recesses 36 has undercuts 28.

Figure 4:
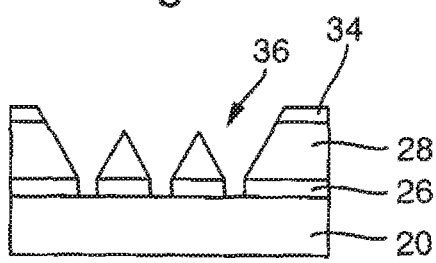
FIG. 4 illustrates an embodiment of a texturing.

In the illustration in FIG. 4, another embodiment of the recesses 36 of the textured third region 33 is drawn, wherein the recesses 36 each extend through the current distribution layer 28 and through the entire tunnel diode 26 to the lower cladding layer 20.

Figure 5:
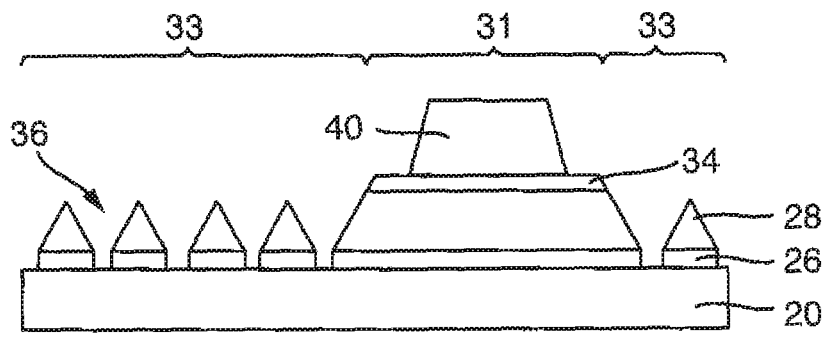
FIG. 5 is a cross-sectional view along the line A-A from FIG. 1.

The illustration in FIG. 5 shows a section along the lines A-A in FIG. 1. Only the differences from the illustration in FIG. 1 are explained below. To simplify the representation, all layers located below the upper cladding layer 20 are not shown.

A cross-section of the finger-shaped first region 31 can be seen between the textured third region 33. The first region 31 is composed of the n-doped contact layer 34 on the current distribution layer 28.

A conductive trace 40 is located on the first region 31. The conductive trace 40 is part of a front-side contact of the light-emitting diode 10. The third textured region 33 is composed of recesses that pass through the current distribution layer and the entire tunnel diode 26.

Figure 6:
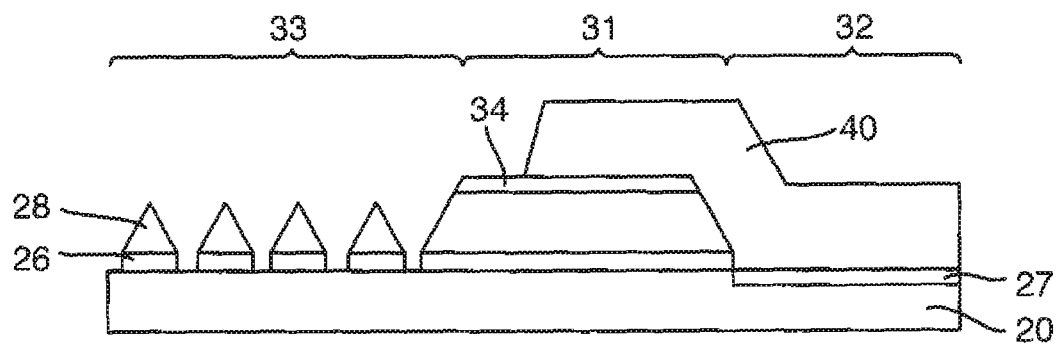
FIG. 6 is a cross-sectional view along the line B-B from FIG. 1.

The illustration in FIG. 6 shows a cross-section along the lines B-B in FIG. 1. Only the differences from the illustration in FIG. 1 are explained below. To simplify the representation, all layers located below the upper cladding layer 20 are not shown.

Adjacent to the textured third region 33 with recesses extending to the upper cladding layer 20 is the first region 31.

A cross-section of the annular structure of the first region 31 can be seen, wherein the first region 31 is composed of the n-doped contact layer 34, which is located on the current distribution layer 28. Adjacent to the first region 31 is the second region 32 formed by the upper cladding layer 20, as a result of which the top 30 of the stacked structure has a step in the region of the transition. The step represents a part of a contact hole with a flat bottom region. Formed in the bottom region of the contact hole is an injection barrier 27 to suppress current entry opposite the stacking direction. Preferably the injection barrier includes a p-n junction.

Arranged on the first and second regions 31 and 32 is an electrically conductive material that also extends over the step and forms another part of the front-side contact of the light-emitting diode 10.

The contact resistance between the electrically conductive material and the second region 32 is at least ten times higher than the contact resistance between the electrically conductive material and the contact layer 34. In this way, an unwanted current flow directed downward toward the active layer 18 is suppressed.

Figure 7:
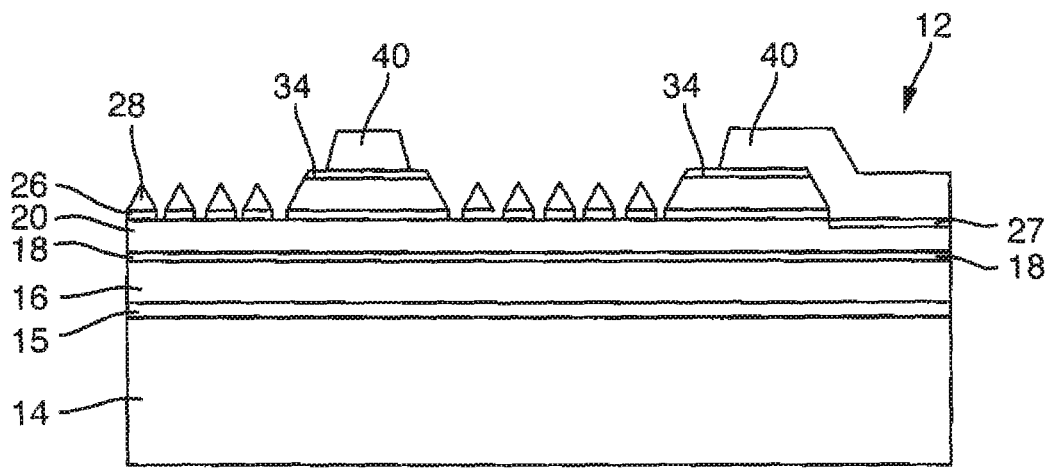
FIG. 7 is a cross-sectional view of the light-emitting diode from FIG. 1.

The illustration in FIG. 7 shows another cross-section of a light-emitting diode 10.

Only the differences from the illustrations in the preceding figures are explained below. The stacked structure 12 has a mirror layer 9 corresponding to the embodiment illustrated in FIG. 2B, and the recesses 36 of the textured third region extend through the entire tunnel diode 26 to the upper cladding layer 20.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A light-emitting diode having a stacked structure composed predominantly of III-V semiconductor layers, the light-emitting diode comprising:
   a first region and a second region and a third region, wherein the first, second, and third regions comprise: a substrate, an n-doped lower cladding layer, an active layer generating electromagnetic radiation, and a p-doped upper cladding layer, wherein the active layer includes a quantum well structure;
   a tunnel diode that is formed on the upper cladding layer and is composed of a $p^+$ layer and an $n^+$ layer, wherein the $p^+$ layer of the tunnel diode includes a III arsenide, and the $n^+$ layer of the tunnel diode includes a III phosphide;
   an n-doped current distribution layer, wherein the current distribution layer includes a III arsenide; and
   an n-doped contact layer, wherein the n-doped contact includes a III arsenide, the n-doped contact layer being covered with a conductive trace,
   wherein at least the lower cladding layer, the active layer, the upper cladding layer, the tunnel diode, and the current distribution layer are monolithic in design,
   wherein the second region and the third region do not have or in part do not have the additional layers of the first region,
   wherein the second region has a contact hole with a bottom region,
   wherein an injection barrier is provided in the bottom region of the contact hole and formed in a planar manner in the upper cladding layer or at the surface of the upper cladding layer or above the upper cladding layer in order to suppress a current flow opposite the stacking direction,
   wherein a conductive trace is provided with which the injection barrier is covered, and
   wherein the third region is textured, the texture having recesses that extend through the current distribution layer and through the $n^+$ layer of the tunnel diode.

2. The light-emitting diode according to claim 1, wherein an AlGaAs layer is formed in the region of the bottom of the contact hole and in the recesses of the texture.

3. The light-emitting diode according to claim 1, wherein the injection barrier includes a p-n junction or an insulation layer.

4. The light-emitting diode according to claim 1, wherein a mirror layer is arranged between the substrate and the lower cladding layer.

5. The light-emitting diode according to claim 1, wherein a bottom of the stacked structure is formed of the substrate or of a contact layer joined to the substrate.

6. The light-emitting diode according to claim 1, wherein the recesses extend through the tunnel diode to the upper cladding layer.

7. The light-emitting diode according to claim 1, wherein the recesses in the shape of truncated polyhedrons.

8. The light-emitting diode according to claim 1, wherein the recesses have a trough-shaped cross-section.

9. The light-emitting diode according to claim 8, wherein the recesses have undercuts.

10. The light-emitting diode according to claim 1, wherein the lower cladding layer and the upper cladding layer include a III arsenide.

* * * * *